(12) United States Patent
Chen et al.

(10) Patent No.: US 7,118,952 B2
(45) Date of Patent: Oct. 10, 2006

(54) METHOD OF MAKING TRANSISTOR WITH STRAINED SOURCE/DRAIN

(75) Inventors: Yun-Hsiu Chen, Hsin-Chu (TW); Syun-Ming Jang, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 69 days.

(21) Appl. No.: 10/890,599

(22) Filed: Jul. 14, 2004

(65) Prior Publication Data

US 2006/0014354 A1    Jan. 19, 2006

(51) Int. Cl.
*H01L 21/8238* (2006.01)
*H01L 21/337* (2006.01)
*H01L 21/00* (2006.01)
*H01L 3/112* (2006.01)

(52) U.S. Cl. .................. 438/199; 438/188; 438/154; 257/69; 257/E21.131; 257/E21.431

(58) Field of Classification Search ................ 438/199, 438/188, 154, 369; 257/E27.064
See application file for complete search history.

(56) References Cited

U.S. PATENT DOCUMENTS

| | | | |
|---|---|---|---|
| 5,595,919 A | 1/1997 | Pan | |
| 6,887,762 B1 * | 5/2005 | Murthy et al. | 438/300 |
| 2003/0080361 A1 | 5/2003 | Murthy et al. | |
| 2003/0170957 A1 | 9/2003 | Hu et al. | |
| 2003/0230811 A1 * | 12/2003 | Kim | 257/758 |
| 2004/0038466 A1 | 2/2004 | Yen et al. | |
| 2004/0048478 A1 | 3/2004 | Cheng et al. | |
| 2005/0035409 A1 * | 2/2005 | Ko et al. | 257/350 |
| 2005/0148148 A1 * | 7/2005 | Cheng | 438/299 |

FOREIGN PATENT DOCUMENTS

WO    WO 00/30169    5/2000

OTHER PUBLICATIONS

T. Ghani et al., "A 90 nm High Volume Manufacturing Logic Technology Featuring Novel 45 nm Gate Length Strained Silicon CMOS Transistors", Portland Technology Development, TCAD, #QRE, Intel Corp., 3 pages.

* cited by examiner

*Primary Examiner*—Long Tran
(74) *Attorney, Agent, or Firm*—Duane Morris LLP

(57) ABSTRACT

A method of fabricating a transistor comprises the steps of: forming a gate electrode above a substrate made of a first semiconductor material having a first lattice spacing, forming recesses in the semiconductor substrate at respective locations where a source region and a drain region are to be formed, epitaxially growing a second semiconductor material having a second lattice spacing different from the first lattice spacing in the recesses, and implanting a dopant in the second semiconductor material after the growing step.

12 Claims, 6 Drawing Sheets

US 7,118,952 B2

METHOD OF MAKING TRANSISTOR WITH STRAINED SOURCE/DRAIN

FIELD OF THE INVENTION

This invention relates to the field of semiconductor manufacturing, and more specifically to a method of manufacturing transistors and devices.

BACKGROUND

Silicon Germanium (SiGe) alloy has been used in non-recessed source/drain regions (such as raised source/drain) for a shallow junction to suppress the short channel effect. The short channel effect is a well-known phenomenon in which the threshold voltage becomes less predictable as the gate dimensions are reduced.

U.S. patent application No. 2003/0080361 describes a process for manufacturing an improved PMOS transistor. Recesses are etched into a layer of epitaxial silicon after formation of spacers adjacent the gate electrode, and implantation of dopant. Source and drain films are deposited in the recesses. The source and drain films are made of an alloy of silicon and germanium. The alloy is epitaxially deposited on the layer of silicon after spacer formation. The alloy has a lattice having the same structure as the structure of the lattice of the layer of silicon. However, due to the inclusion of the germanium, the lattice of the alloy has a larger spacing than the spacing of the lattice of the layer of silicon. The larger spacing creates a stress in a channel of the transistor between the source and drain films. Silicon under a biaxially stressed film, such as SiGe, enhances carrier mobility to improve current performance.

However, the short channel effect was increased as a result of the higher temperature conditions of epitaxially forming the silicon/geranium alloy in the source drain regions. An improved fabrication method that can improve device performance and the processing window is desired.

SUMMARY OF THE INVENTION

In some embodiments, a method of fabricating a transistor comprises the steps of: forming a gate electrode above a substrate made of a first semiconductor material having a first lattice spacing, forming recesses in the semiconductor substrate at respective locations where a source region and a drain region are to be formed, epitaxially growing a second semiconductor material having a second lattice spacing different from the first lattice spacing in the recesses, and implanting a dopant in the second semiconductor material to form a pocket or lightly doped drain implant after the growing step.

In some embodiments, a method of fabricating a CMOS device including a PMOS transistor and an NMOS transistor, comprises the steps of: forming gate electrodes for the PMOS transistor and for the NMOS transistor above a substrate made of a first semiconductor material having a first lattice spacing, forming recesses in the semiconductor substrate at respective locations adjacent the gate electrode of the PMOS transistor, where a source region and a drain region are to be formed, epitaxially growing a second semiconductor material having a second lattice spacing different from the first lattice spacing in the recesses, and implanting dopants in the PMOS and NMOS transistors to form a pocket or lightly doped drain implant after the growing step.

DETAILED DESCRIPTION

Figure 1:
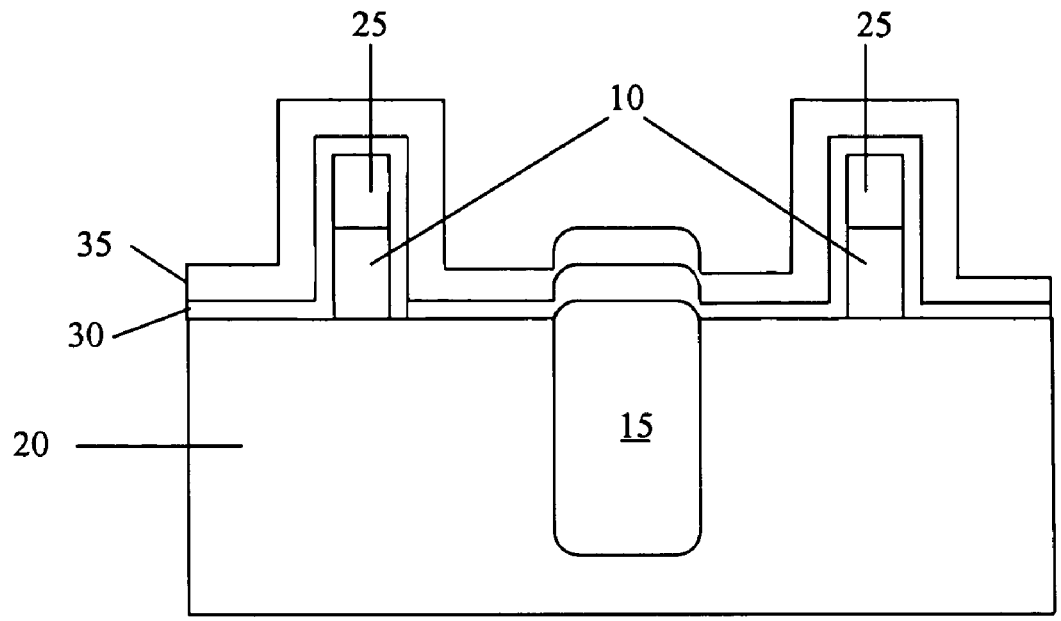
FIG. 1 is a cross-sectional view of a semiconductor structure comprising two gate electrodes separated by a shallow trench isolation structure (STI)

The following detailed description of a preferred embodiment of the invention is to be considered together with the accompanying drawings wherein like numbers refer to like parts and further wherein the drawings are to be considered part of the entire written description. Terms used to describe the preferred structure and process embodiments have traditional meaning in the art. Relative terms such as "horizontal", vertical, "up", "down", "top", "bottom" should be construed to refer to the orientation as described or as shown in the drawing figure under discussion. The drawing figures are not to scale and certain features may be shown exaggerated in scale or in somewhat schematic form in the interest of clarity and conciseness.

U.S. patent application Ser. No. 10/002,465 filed Nov. 1, 2001 (U.S. Patent Application Publication No. U.S. 2003/0080361 A1, May 1, 2003) is incorporated by reference herein in its entirety, as though fully set forth below.

FIGS. 1–12 show an exemplary method of forming a PMOS transistor having strained source/drain regions, and a CMOS device including the PMOS transistor. In the examples, the Pocket and/or lightly doped drain (LDD) implants are processed after selective epitaxial SiGe deposition in the PMOS source/drain region recesses.

Referring to FIG. 1, two gate electrodes 10 separated by a shallow trench isolation structure (STI) 15 are formed on the surface of a semiconductor substrate 20 made of a material having a first lattice spacing. In some embodiments, the substrate 20 comprises an epitaxial silicon layer formed on a monocrystalline silicon wafer substrate. The gate electrodes 10 may be formed of polycrystalline silicon, for example. A hard mask layer 25 of a material such as silicon oxynitride or SiN may be formed over the two gate electrodes 10. Subsequently, an oxide layer 30 (e.g., SiO, TEOS, or RTO oxide) and a silicon nitride 35 masking layer are applied over the surface of the substrate 20.

In some embodiments, another oxide layer (not shown) is deposited above the SiN layer 35, for forming ONO spacers.

Figure 2:
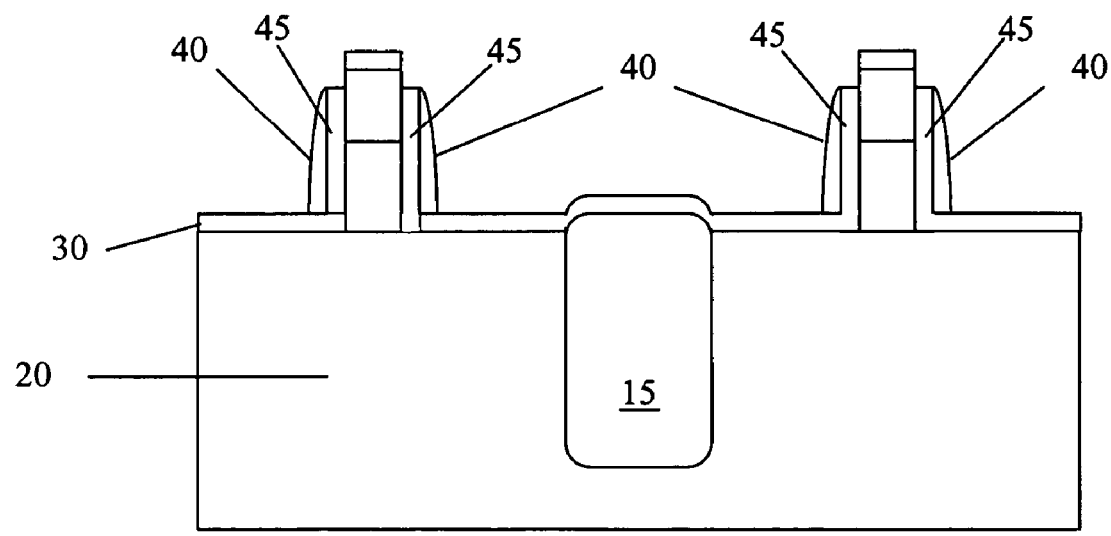
FIG. 2 is a cross-sectional view of the structure of FIG. 1 after a highly selective silicon nitride etch back process has been completed.

Referring to FIG. 2, a highly selective silicon nitride etch back process is employed to produce a first set of silicon nitride spacers 40 and silicon oxide spacers 45 adjacent the gate electrodes 10.

If the optional second oxide layer (not shown) was provided above the SiN layer 35, the second oxide layer is removed by the SiN etch back process of this step, except for a small residual layer above the spacers 40. Then an extra step is performed to remove the remainder of the second oxide layer, for example, by an HF dip.

Figure 3:
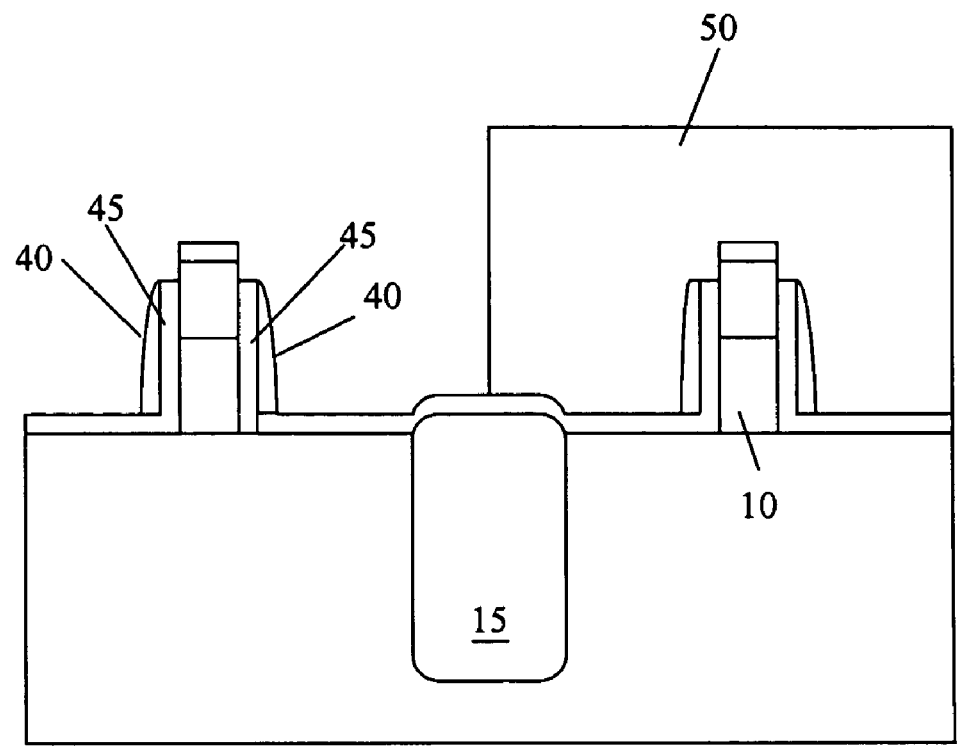
FIG. 3 is a cross-sectional view of the structure of FIG. 2 wherein a photoresist is applied over one electrode and a portion of the STI structure.

Referring to FIG. 3, a P+ implant photomask 50 comprising a photoresist is next applied over the NMOS transistor area. The exposed region defines the area available for subsequent recess etching. Thus, the recess etching area is only defined for the PMOS transistor.

Figure 4:
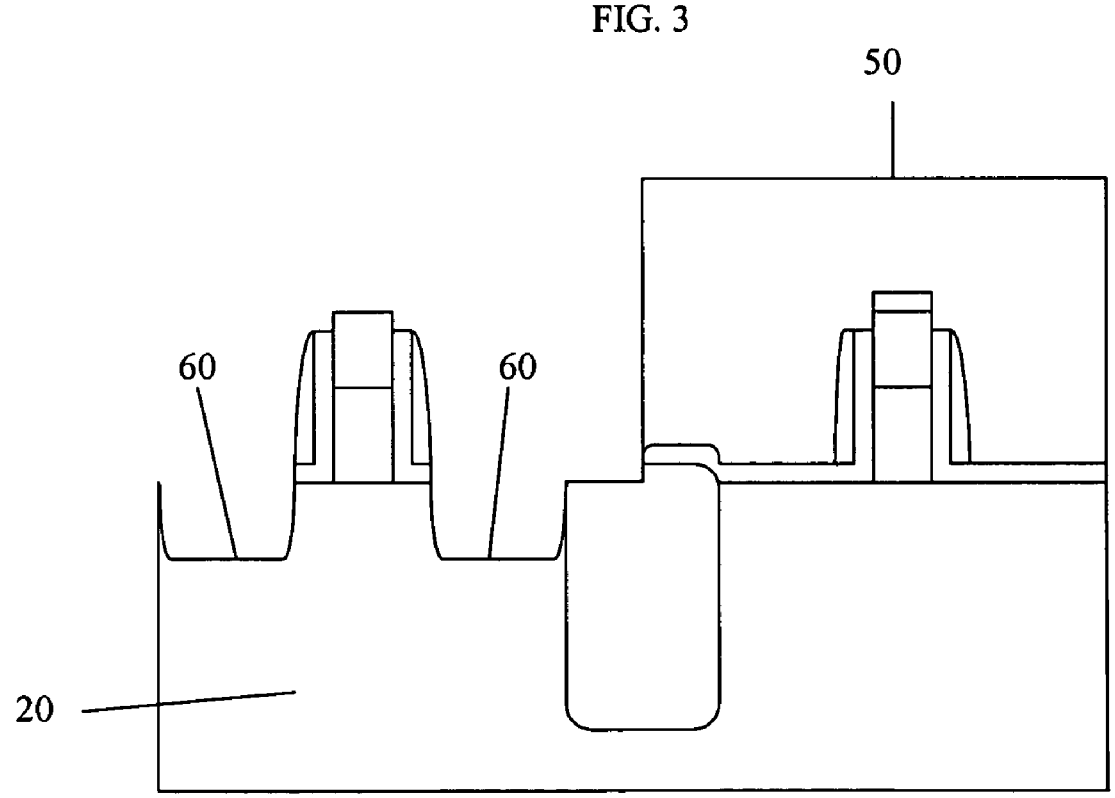
FIG. 4 is a cross-sectional view of the structure produced after a recess etching process has been completed on the unprotected area of the structure shown in FIG. 3.

Referring to FIG. 4, recessed areas 60 for the PMOS transistor are then formed in the semiconductor substrate 20, for example, by using a known etching method to selectively etch the oxide and substrate, but not the spacers 40.

Figure 5:
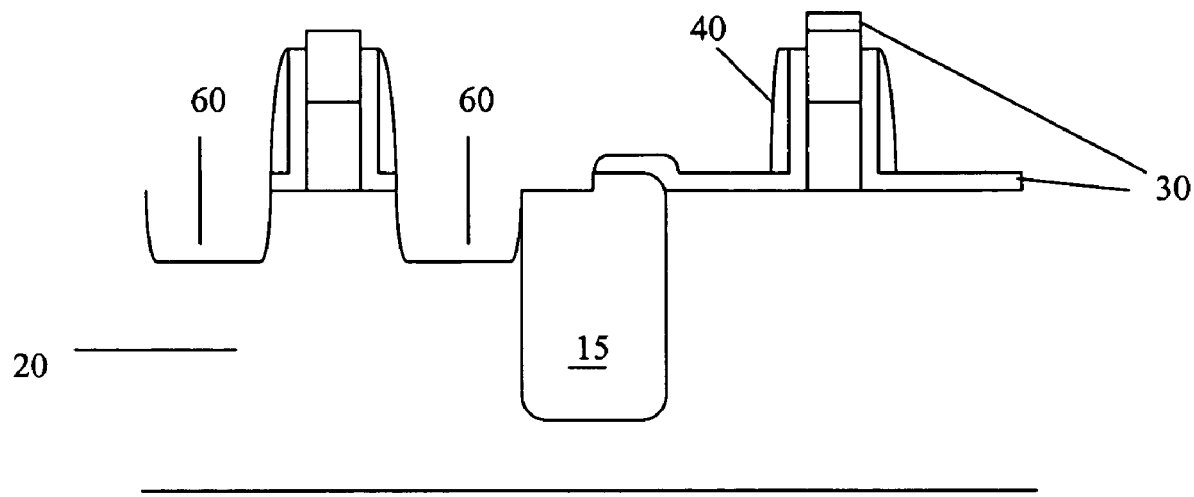
FIG. 5 is a cross-sectional view of the structure of FIG. 4 after removal of the photoresist.

Referring to FIG. 5, the photoresist 50 is then stripped, to expose the NMOS transistor region. Unlike the PMOS transistor region, there are no recesses in the source and drain regions of the NMOS transistor.

Figure 6:
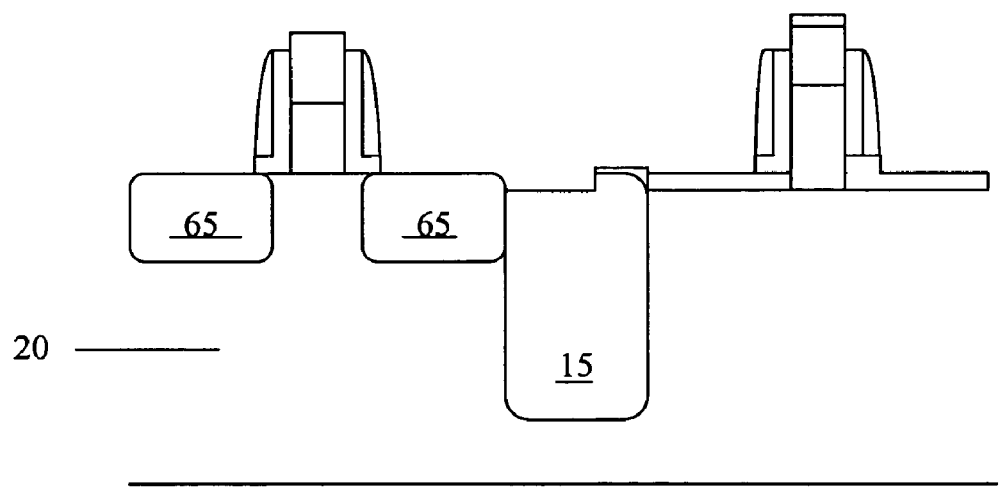
FIG. 6 is a cross-sectional view of the structure shown in FIG. 5 after selective epitaxial growth of SiGe alloy into the recessed regions.

Referring to FIG. 6, source and drain regions 65 are formed by epitaxial deposition of SiGe alloy in the recesses 60, for example by known CVD methods at high temperature, e.g. 650~850° C. The lattice spacing of the SiGe alloy is different from the first lattice spacing of the semiconductor material of substrate 20. The germanium present in the combination of the silicon and the germanium may be about 15 atomic percent. It is known that epitaxy can be maintained with a germanium concentration of up to about 20 atomic percent of the combination of the silicon and germanium by volume. It is also understood that other materials can optionally be incorporated into the SiGe alloy.

Figure 7:
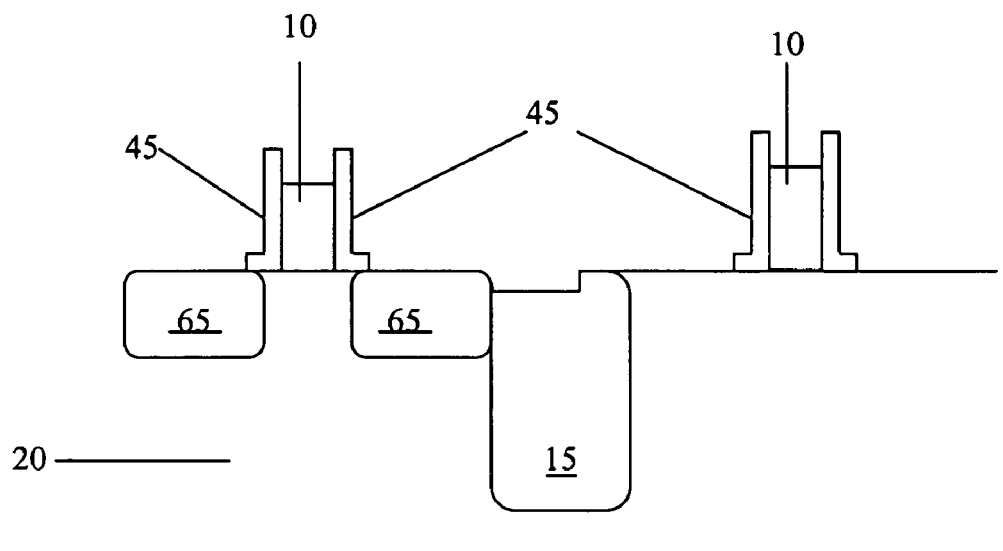
FIG. 7 is a cross-sectional view of the structure of FIG. 6, after removal of silicon nitride and gate electrode hard masking layers.

Referring to FIG. 7, the silicon nitride spacers 40 and gate hard mask layer 25 are subsequently removed, for example by a phosphoric acid ($H_3PO_4$) etch back process. An $H_3PO_4$ process may be preferred, because it reduces the critical dimension (CD) bias of the PFET polysilicon after the hard mask is removed, and provides surface roughness control.

Figure 8:
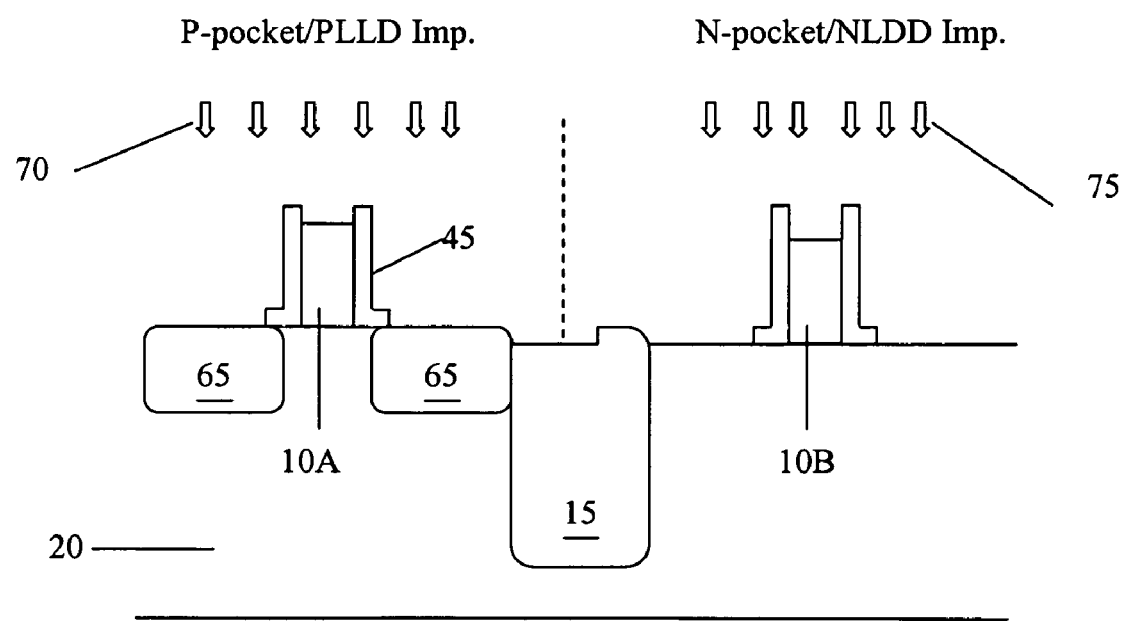
FIG. 8 is a cross-sectional view that shows selective implantation on each gate electrode to produce a P-pocket/PLDD or N-Pocket/NLDD dopant implants.

Referring to FIG. 8, the resultant PMOS transistor source/drain extension (SDE) region, including gate electrode 10A, silicon oxide spacers 45 and source/drain regions 65, is completed by P-pocket/P-LDD implant 70. This may be done, for example, using standard methods. The NMOS transistor is completed by an N-pocket/N-LDD implant 75. In some embodiments, as shown in FIG. 8, the oxide spacers 45 are left in place while the pocket/LDD implants are performed.

Figure 9:
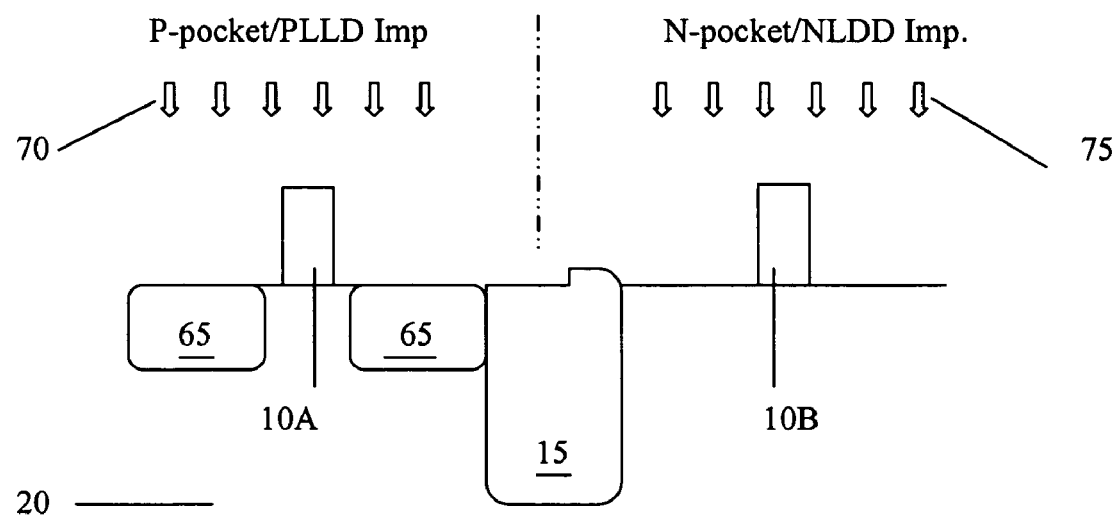
FIG. 9 is a cross-sectional view that shows optional removal of the silicon oxide spacers before dopant implantation.

Referring to FIG. 9, in some alternative embodiments, the silicon oxide spacers 45 are removed before the pocket/LDD implants are performed.

Figure 10:
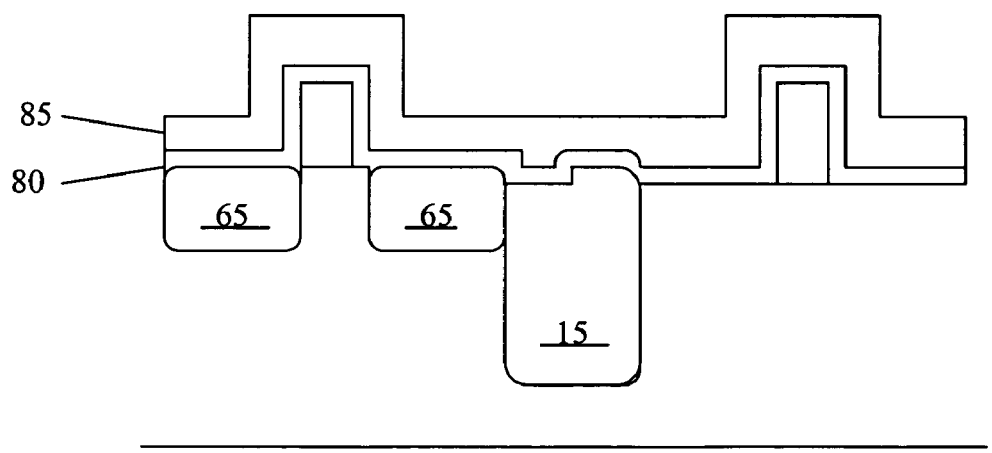
FIG. 10 is a cross-sectional view that shows the structures of FIG. 8 or 9 after the deposition of silicon oxide and silicon nitride masking layers.

Referring to FIG. 10, silicon oxide 80 and silicon nitride 85 spacer layers are applied over the PMOS and NMOS transistors of FIG. 8 or FIG. 9. The silicon oxide layer 80 is typically applied via known LPCVD or PECVD procedures using TEOS as a source. The silicon nitride layer 85 is typically applied using well known LPCVD or PECVD procedures. In some embodiments, the oxide layer 80 may include oxide from spacers 45 that is not removed, as shown in FIG. 8.

Figure 11:
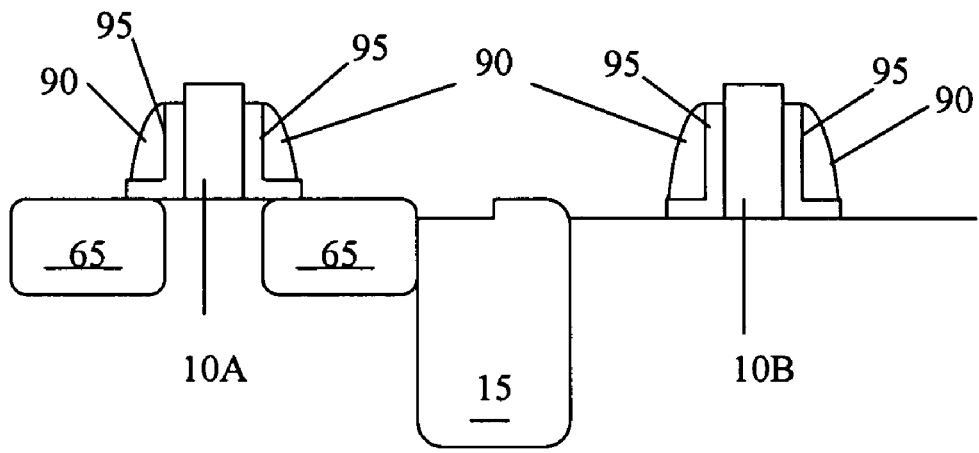
FIG. 11 is a cross-sectional view showing silicon nitride spacer formation after etching the structure of FIG. 10.

Referring to FIG. 11, a second set of silicon nitride spacers 90 and silicon oxide spacers 95 are then formed adjacent each gate electrode 10A–B using a highly selective silicon nitride etch back process.

Figure 12:
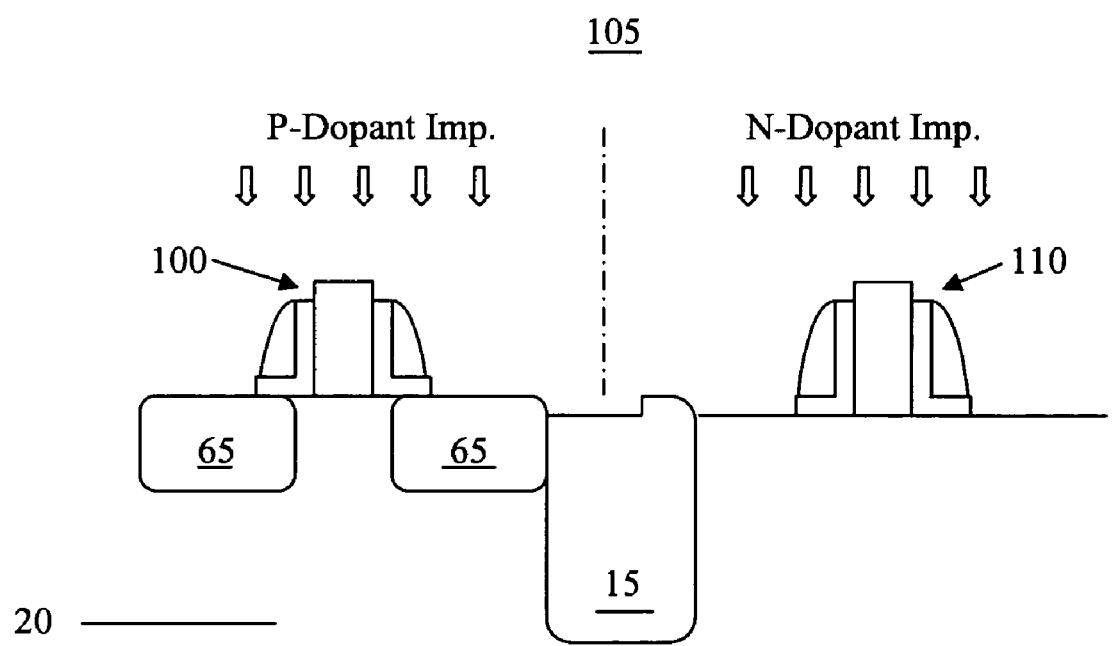
FIG. 12 is a cross-sectional view showing selective P and N dopant implantation in the structure of FIG. 11.

Referring to FIG. 12, a PMOS transistor 100 is formed by selectively performing a P+ dopant implant in the area defined by gate electrode 10A and source and drain regions 65 of FIG. 8. The NMOS device 110 can be formed by selectively performing an N+ dopant implant in the area defined by gate electrode 10B and adjacent surfaces of the semiconductor material. This completes the CMOS structure 105. Although an example of a CMOS structure 105 is provided, the method described above may be used to fabricate any PMOS transistor, for example, to be included in logic, input/output (I/O), static random access memory (SRAM), or the like.

The process described in FIGS. 1–12, wherein LDD/Pocket implantation occurs after the formation of the Epitaxial SiGe alloy source and drain regions, provides for better control of implantation in a transistor with strained source/drain, especially the LDD/Pocket implants, in the final structure. This control improves the processing window and provides more flexible tuning of a transistor and enhanced performance of a CMOS device. Because the implants are performed after the epitaxial growth of the SiGe material in the source/drain region recesses, there is no impact on the thermal budget of the SiGe growth. The examples described above are compatible with existing processes using either SiN spacers or composite spacers.

Although the invention has been described in terms of exemplary embodiments, it is not limited thereto. Rather, the invention should be construed broadly, to include other variants and embodiments, which may be made by those skilled in the art without departing from the scope and range of equivalents of the appended claims.

What is claimed is:

1. A method of fabricating a transistor, comprising the steps of:
    forming a gate electrode above a substrate made of a first semiconductor material having a first lattice spacing;
    forming a first spacer adjacent to the gate electrode;
    forming recesses in the semiconductor substrate at respective locations where a source region and a drain region are to be formed-after forming the first spacer;
    epitaxially growing a second semiconductor material having a second lattice spacing different from the first lattice spacing to fill the recesses up to a surface of the substrate, wherein the transistor is a PMOS transistor, the PMOS transistor is a component in a CMOS device, and an NMOS transistor of the CMOS device is formed without growing the second semiconductor material in source and drain regions of the NMOS device;
    implanting a dopant in the second semiconductor material after the growing step; and
    removing the first spacer after the implantation step.

2. The method of claim 1, wherein the implanting step comprises implanting a dopant to form a pocket implant or lightly doped drain (LDD) in the second semiconductor material after the growing step.

3. The method of claim 2, further comprising:
    forming a first spacer adjacent to the gate electrode before forming the recesses; and
    removing the first spacer before forming the pocket implant or LDD.

4. The method of claim 2, further comprising removing a hard mask above said gate electrode before forming the pocket implant or LDD.

5. The method of claim 2, further comprising forming a second spacer adjacent to the gate electrode after forming the pocket implant or LDD but before forming the source and drain regions.

6. The method of claim 1, wherein the implanting step comprises implanting a dopant in the second semiconductor material to form the source and drain regions in the second semiconductor material.

7. The method of claim 1, wherein said second semiconductor material comprises SiGe alloy.

8. The method of claim 7, wherein Ge in the SiGe alloy is from about 15 atomic percent to about 20 atomic percent.

9. A method of fabricating a CMOS device comprising a PMOS transistor and an NMOS transistor, comprising the steps of:
   forming a gate electrode for the PMOS transistor and for the NMOS transistor above a substrate made of a first semiconductor material having a first lattice spacing;
   forming a first spacer adjacent to the gate electrodes;
   forming recesses in the semiconductor substrate at respective locations adjacent the gate electrode of the PMOS transistor, where a source region and a drain region are to be formed after forming the first spacer;
   epitaxially growing a second semiconductor material having a second lattice spacing different from the first lattice spacing to fill the recesses up to a surface of the substrate, wherein the second semiconductor material is not formed in source and drain regions of the NMOS device;
   removing the first spacer after the growing step; and
   implanting dopants in the PMOS and NMOS transistors after the growing step.

10. The method of claim 9, wherein the implanting step comprises forming a pocket implant or a lightly doped chain, the method further comprising:
   forming a second spacer adjacent each electrode after the implanting step; and
   implanting dopants to form source and drain regions after forming the second spacer.

11. The method of claim 9, wherein said second semiconductor material comprises SiGe alloy.

12. The method of claim 11, wherein Ge in the SiCk alloy is from about 15 atomic percent to about 20 atomic percent.

* * * * *

UNITED STATES PATENT AND TRADEMARK OFFICE
CERTIFICATE OF CORRECTION

PATENT NO. : 7,118,952 B2
APPLICATION NO. : 10/890599
DATED : October 10, 2006
INVENTOR(S) : Yun-Hsiu Chen and Syun-Ming Jang It is certified that error appears in the above-identified patent and that said Letters Patent is hereby corrected as shown below:

Column 4, line 58 in Claim 1, replace "implantation" with --implanting--

Column 5, line 7 in Claim 5, replace "dram" with --drain--

Column 5, line 19 in Claim 9, replace "a gate electrode" with --gate electrodes--

Column 6, line 13 in Claim 10, replace "chain" with --drain--

Column 6, line 21 in Claim 12, replace "SiCk" with --SiGe--

Signed and Sealed this

Twenty-fourth Day of April, 2007

JON W. DUDAS
*Director of the United States Patent and Trademark Office*